(12) United States Patent
Yen et al.

(10) Patent No.: US 8,716,740 B1
(45) Date of Patent: May 6, 2014

(54) ELECTRODE STRUCTURE FOR AN LED

(71) Applicant: High Power Opto. Inc., Taichung (TW)

(72) Inventors: Wei-Yu Yen, Taichung (TW); Fu-Bang Chen, Taichung (TW); Chih-Sung Chang, Taichung (TW)

(73) Assignee: Highpower Opto. Inc., Taichung (TW)

( * ) Notice: Subject to any disclaimer, the term of this patent is extended or adjusted under 35 U.S.C. 154(b) by 0 days.

(21) Appl. No.: 13/724,770

(22) Filed: Dec. 21, 2012

(51) Int. Cl.
*H01L 33/00* (2010.01)
*H01L 33/38* (2010.01)
*H01L 33/22* (2010.01)

(52) U.S. Cl.
CPC ............. *H01L 33/382* (2013.01); *H01L 33/22* (2013.01)
USPC ............................................. 257/98; 257/99

(58) Field of Classification Search
CPC ............................... H01L 33/382; H01L 33/22
USPC ........................................................ 257/98, 99
See application file for complete search history.

(56) References Cited

U.S. PATENT DOCUMENTS 6,630,366 B2 * 10/2003 Taniguchi et al. .............. 438/34

\* cited by examiner

*Primary Examiner* — Tu-Tu Ho
(74) *Attorney, Agent, or Firm* — Muncy, Geissler, Olds & Lowe, P.C.

(57) ABSTRACT

An electrode structure for an LED includes a plurality of blind holes and a plurality of N-type metal electrodes. The LED comprises, in this order by stacking, an intrinsic semiconductor layer, an N-type semiconductor layer, a light emitting layer, a P-type semiconductor layer, a mirror layer, a buffer layer, a bonding layer, a permanent substrate and a P-type electrode. The blind holes are distributed in a pattern and run through the intrinsic semiconductor layer to reach the N-type semiconductor layer. The N-type metal electrodes respectively run through the blind holes to connect the N-type semiconductor layer. Through a 3D contact interface formed by the blind hole, not only contact impedance between the N-type metal electrode and the N-type semiconductor layer can be reduced, the N-type metal electrode also can be firmly held in the blind hole without peeling off.

10 Claims, 5 Drawing Sheets

ELECTRODE STRUCTURE FOR AN LED

FIELD OF THE INVENTION

The present invention relates to a light emitting diode (LED) and particularly to an electrode structure for an LED.

BACKGROUND OF THE INVENTION

LED has many characteristics, such as slim, lightweight, power-saving and the like, hence is widely used nowadays. It mainly includes multiple layers made of semiconductor materials and stacked by epitaxy. Take a blue light LED as an example, it mainly consists of GaN-based epitaxy films.

Please refer to FIG. 1 for a conventional vertical LED. It is a sandwich structure including an N-type semiconductor layer 1, a light emitting layer 2, and a P-type semiconductor layer 3. Beneath the P-type semiconductor layer 3, there are in this order by stacking, a mirror layer 4, a buffer layer 5, a bonding layer 6, a silicon substrate 7 and a P-type electrode 8. The surface of the N-type semiconductor layer 1 can be treated in a roughening process to increase light extraction efficiency. An N-type electrode 9 also is disposed thereon. When a voltage is applied to the N-type electrode 9 and P-type electrode 8, the N-type semiconductor layer 1 provides electrons while the P-type semiconductor layer 3 provides electron holes. The electrons and the electron holes are recombined to generate light.

The N-type electrode 9 usually is formed on the N-type semiconductor layer 1 through a thin film manufacturing process. Because the contact area is in inverse proportion to the contact impedance, thus a smaller contact area produces greater impedance. Moreover, because materials generally selected for the N-type electrode 9 and the N-type semiconductor layer 1 cannot provide preferable adhesion between them to result in insufficient bonding strength, the N-type electrode 9 is easily to be peeled off from the N-type semiconductor layer 1 to cause damage of the LED.

SUMMARY OF THE INVENTION

The primary object of the present invention is to provide an electrode structure for an LED to enhance bonding strength of fixed electrodes.

The secondary object of the invention is to provide an electrode structure for an LED to reduce contact impedance.

To achieve the foregoing objects, the electrode structure according to the invention is applied for an LED. The LED includes, in this order by stacking, an intrinsic semiconductor layer, an N-type semiconductor layer, a light emitting layer, a P-type semiconductor layer, a mirror layer, a buffer layer, a bonding layer, a permanent substrate and a P-type electrode. The electrode structure includes a plurality of blind holes and a plurality of N-type metal electrodes.

The blind holes are distributed in a pattern and run through the intrinsic semiconductor layer to reach the N-type semiconductor layer. The N-type metal electrodes respectively run through the blind holes to connect the N-type semiconductor layer.

By means of the structure set forth above, the invention maintains the intrinsic semiconductor layer to provide more buffer space for a surface roughening process, which can avoid damage of the LED. Moreover, through a three-dimensional (3D) contact interface formed by the blind hole, not only the contact area between the N-type metal electrode and the N-type semiconductor layer are increased to reduce contact impedance, but also the N-type metal electrode can be firmly held in the blind hole without peeling off.

The foregoing, as well as additional objects, features and advantages of the invention will be more readily apparent from the following detailed description, which proceeds with reference to the accompanying embodiments and drawings. The embodiments merely serve for illustrative purpose and are not the limitation of the invention.

DETAILED DESCRIPTION OF THE PREFERRED EMBODIMENTS

Figure 1:
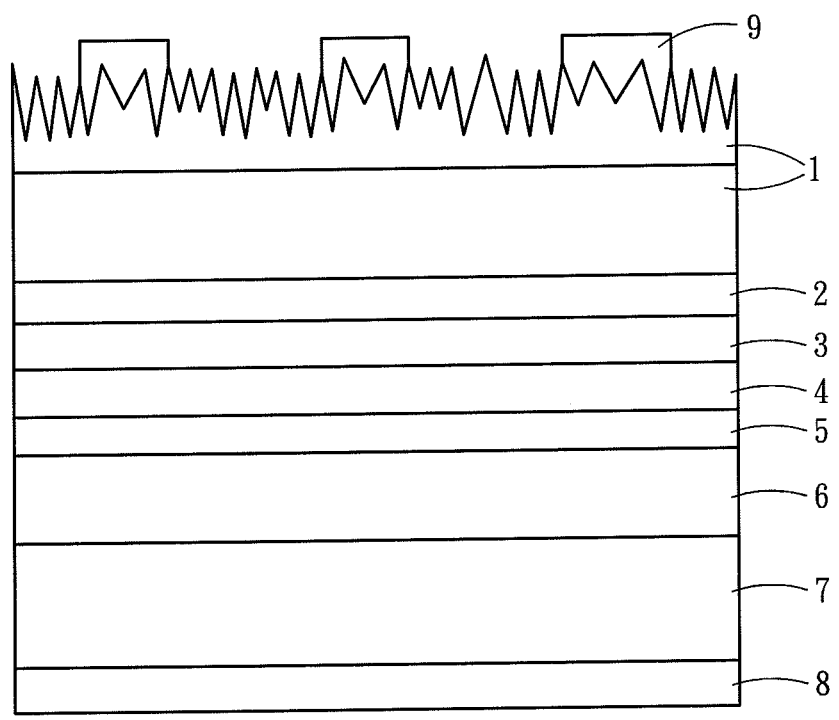
FIG. 1 is a schematic view of a conventional LED structure.
Figure 2:
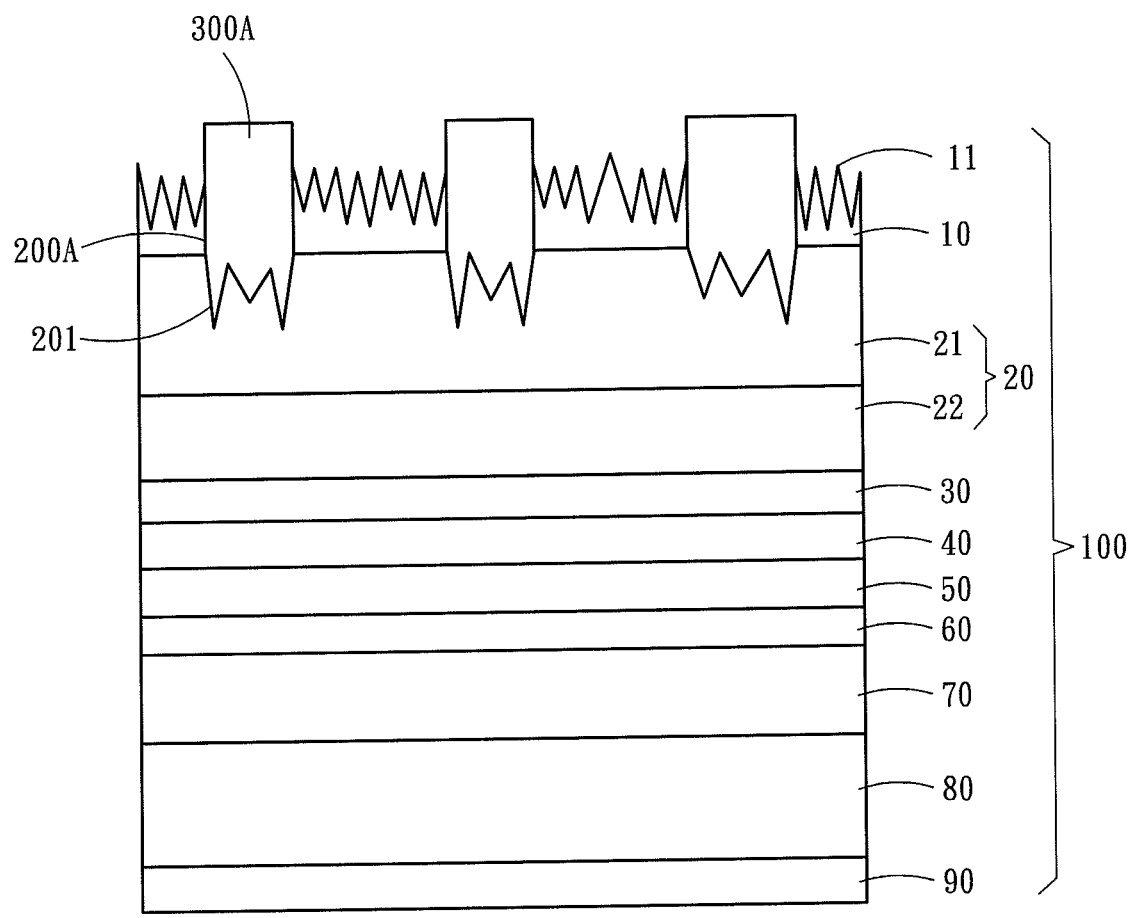
FIG. 2 is a schematic view of a first embodiment of the invention.

Please refer to FIG. 2 for a first embodiment of the invention. It includes a plurality of blind holes 200A and a plurality of N-type metal electrodes 300A on an LED 100. The LED 100 comprises, in this order by stacking, an intrinsic semiconductor layer 10, an N-type semiconductor layer 20, a light emitting layer 30, a P-type semiconductor layer 40, a mirror layer 50, a buffer layer 60, a bonding layer 70, a permanent substrate 80 and a P-type electrode 90. The intrinsic semiconductor layer 10 has an irregular surface 11. The N-type semiconductor layer 20 includes a first N-type semiconductor layer 21 and a second N-type semiconductor layer 22.

The intrinsic semiconductor layer 10 is preferably formed at a thickness between 2 μm and 4 μm. The blind holes 200A are distributed in a pattern and run through the intrinsic semiconductor layer 10 to reach the N-type semiconductor layer 20 (i.e. the first N-type semiconductor layer 21). Moreover, each blind hole 200A runs into the N-type semiconductor layer 20 to form an irregular contact surface 201. The N-type metal electrodes 300A respectively run through the blind holes 200A to connect the N-type semiconductor layer 20. The N-type metal electrodes 300A are formed at a thickness between 5 μm and 6 μm.

Thus, through a 3D contact interface (with a lower side connecting to lateral sides) formed between the N-type metal electrode 300A and the N-type semiconductor layer 20 (i.e. the first N-type semiconductor layer 21), a greater contact area is formed to effectively reduce contact impedance. Moreover, the N-type metal electrode 300A is inserted into the blind hole 200A, a greater bonding force is formed without peeling off, therefore can meet use requirements.

Figure 3:
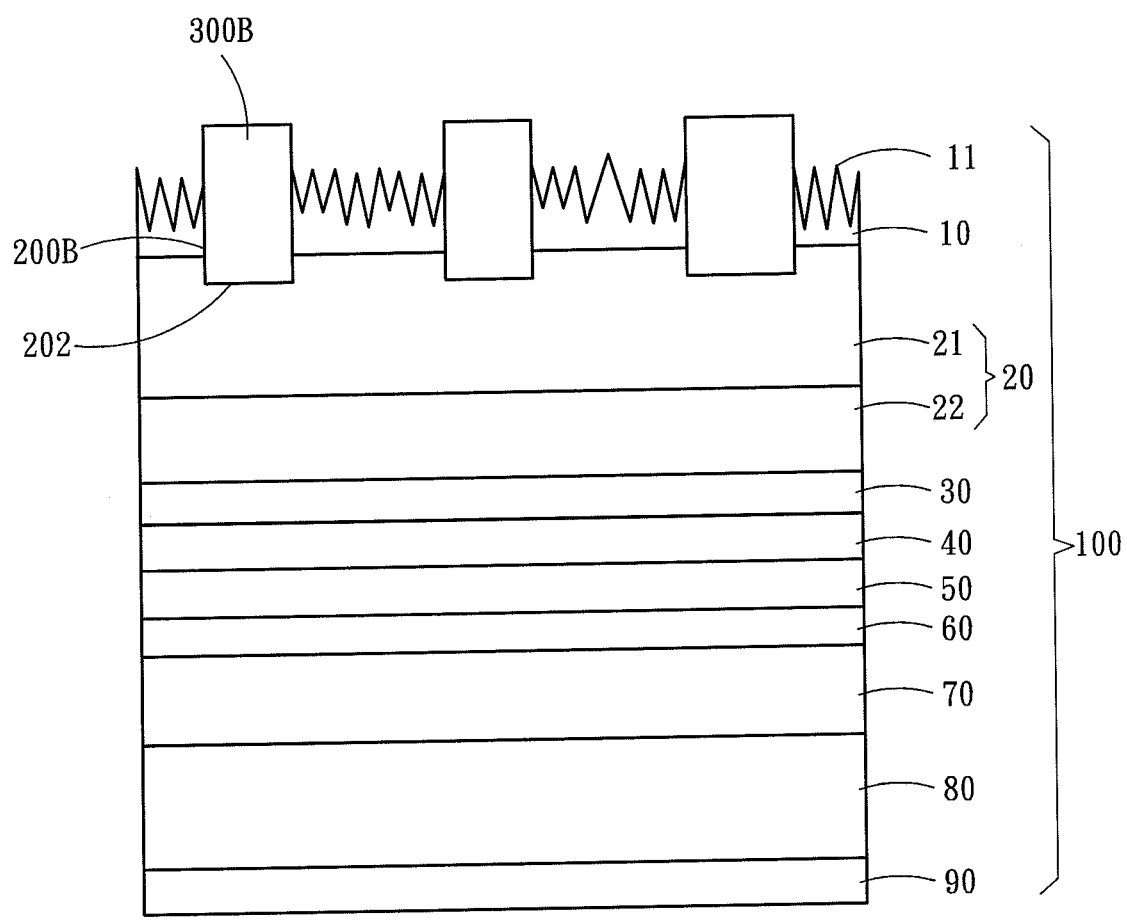
FIG. 3 is a schematic view of a second embodiment of the invention.

Please refer to FIG. 3 for a second embodiment of the invention. In this embodiment, each blind hole 200B runs into the N-type semiconductor layer 20 to form a flat contact surface 202, hence can avoid insufficient buffer space for the roughening process. It differs from the first embodiment by sacrificing some contact area, but still can allow the N-type metal electrodes 300B to be inserted into the blind holes 200B to prevent peeling-off problem.

Figure 4:
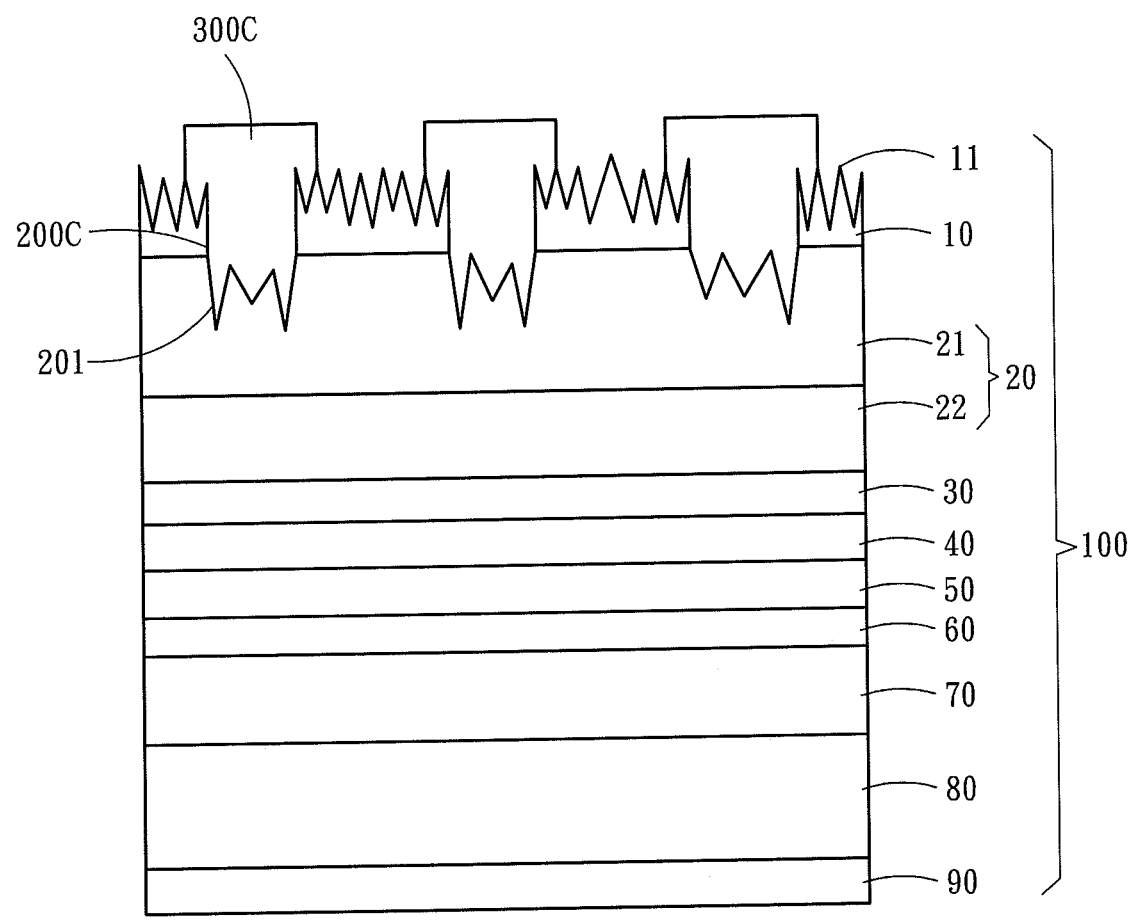
FIG. 4 is a schematic view of a third embodiment of the invention.

Please refer to FIG. 4 for a third embodiment of the invention. In this embodiment, the N-type metal electrodes 300C are formed at an area greater than that of the blind holes 200C to surround the circumference of the blind holes 200C and form on the intrinsic semiconductor layer 10, thus firmness of the N-type metal electrodes 300C can be enhanced. Moreover, each blind hole 200C runs into the N-type semiconductor layer 20 to form an irregular contact surface 201, hence the contact area also can be increased to reduce the contact impedance. The irregular contact surface 201 can be formed through physical methods or chemical etching methods, such as plasma bombardment or the like.

Figure 5:
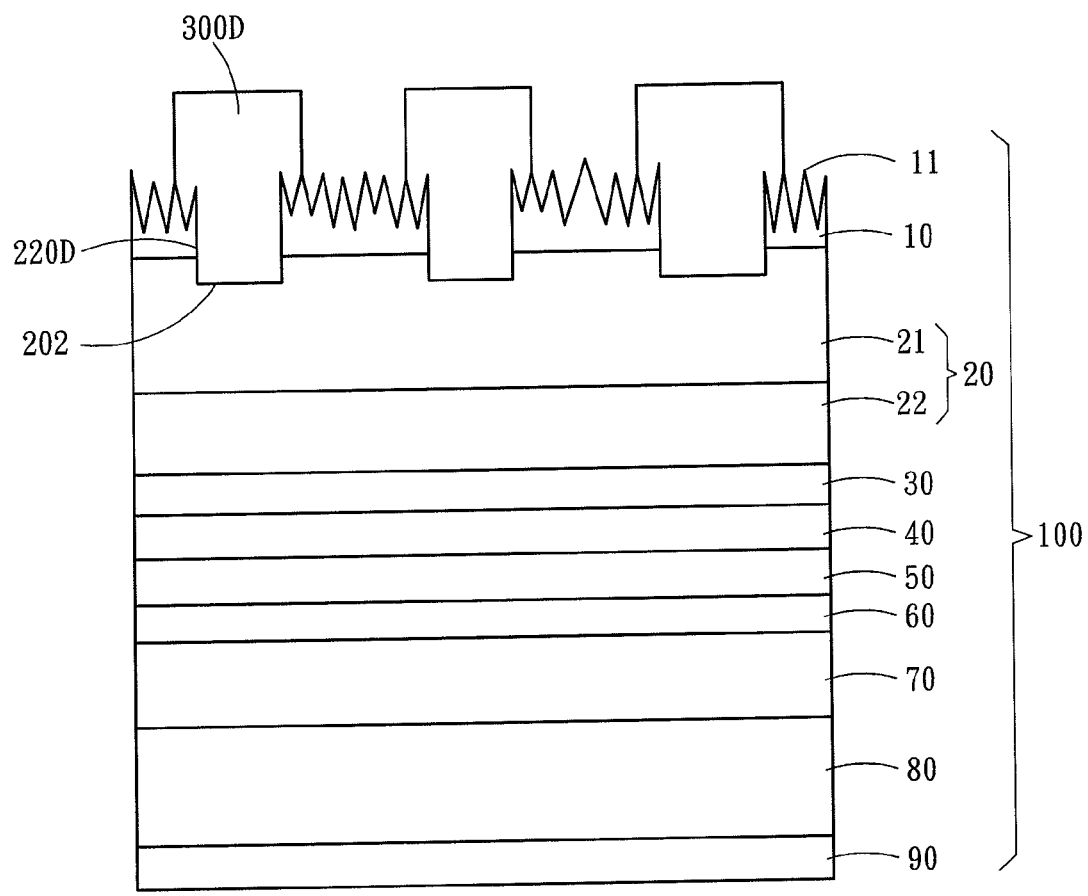
FIG. 5 is a schematic view of a fourth embodiment of the invention.

Please refer to FIG. 5 for a fourth embodiment of the invention. In this embodiment, the N-type metal electrodes 300D are also formed at an area greater than that of the blind holes 200D to surround the circumference of the blind holes 200D and form on the intrinsic semiconductor layer 10, thus firmness of the N-type metal electrodes 300D can be enhanced. Moreover, each blind hole 200D runs into the N-type semiconductor layer 20 to form a flat contact surface 202, hence can avoid the problem of insufficient buffer space for the roughening process.

As mentioned above, the invention retains the intrinsic semiconductor layer to provide more buffer space for the roughening process, hence can avoid damage of the LED. Moreover, through a 3D contact interface (with the lower side connecting to lateral sides) formed by the blind hole to hold the N-type metal electrode, not only contact area is increased to reduce contact impedance between the N-type metal electrode and N-type semiconductor layer, but also the N-type metal electrode can be firmly held in the blind hole without peeling off.

What is claimed is:

1. An electrode structure for a light emitting diode which includes an intrinsic semiconductor layer, an N-type semiconductor layer, a light emitting layer, a P-type semiconductor layer, a mirror layer, a buffer layer, a bonding layer, a permanent substrate and a P-type electrode that are stacked in sequence, comprising:
    a plurality of blind holes which are distributed in a pattern and run through the intrinsic semiconductor layer to reach the N-type semiconductor layer; and
    a plurality of N-type metal electrodes respectively running through the plurality of blind holes to connect the N-type semiconductor layer.

2. The electrode structure for the light emitting diode of claim 1, wherein the intrinsic semiconductor layer is formed at a thickness ranged from 2 to 4 µm.

3. The electrode structure for the light emitting diode of claim 1, wherein the plurality of blind holes run into the N-type semiconductor layer to form a flat contact surface.

4. The electrode structure for the light emitting diode of claim 1, wherein the plurality of blind holes run into the N-type semiconductor layer to form an irregular contact surface.

5. The electrode structure for the light emitting diode of claim 1, wherein the plurality of N-type metal electrodes are formed at a thickness ranged from 5 to 6 µm.

6. The electrode structure for the light emitting diode of claim 1, wherein the plurality of N-type metal electrodes are formed at an area greater than that of the plurality of blind holes to surround the circumference of the plurality of blind holes and form on the intrinsic semiconductor layer.

7. The electrode structure for the light emitting diode of claim 6, wherein the plurality of blind holes run into the N-type semiconductor layer to form a flat contact surface.

8. The electrode structure for the light emitting diode of claim 6, wherein the plurality of blind holes run into the N-type semiconductor layer to form an irregular contact surface.

9. The electrode structure for the light emitting diode of claim 1, wherein the N-type semiconductor layer includes a first N-type semiconductor layer and a second N-type semiconductor layer, the plurality of blind holes running through the intrinsic semiconductor layer to reach the first N-type semiconductor layer.

10. The electrode structure for the light emitting diode of claim 1, wherein the intrinsic semiconductor layer includes an irregular surface.

* * * * *